(12) United States Patent
Kim et al.

(10) Patent No.: US 10,916,572 B2
(45) Date of Patent: Feb. 9, 2021

(54) PIXEL OF IMAGE SENSOR USING HIGH-SPEED CHARGE TRANSFER

(71) Applicant: UNIST(ULSAN NATIONAL INSTITUTE OF SCIENCE AND TECHNOLOGY), Ulsan (KR)

(72) Inventors: Seong Jin Kim, Anyang-si (KR); Seung Hyun Lee, Dongnae-gu (KR)

(73) Assignee: UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 0 days.

(21) Appl. No.: 16/534,899

(22) Filed: Aug. 7, 2019

(65) Prior Publication Data

US 2020/0227453 A1 Jul. 16, 2020

(30) Foreign Application Priority Data

Jan. 16, 2019 (KR) .................. 10-2019-0005854

(51) Int. Cl.
*H01L 27/146* (2006.01)

(52) U.S. Cl.
CPC .. *H01L 27/14612* (2013.01); *H01L 27/14601* (2013.01); *H01L 27/14607* (2013.01)

(58) Field of Classification Search
CPC ..... H01L 27/14; H01L 27/144; H01L 27/146; H01L 27/14601; H01L 27/14603; H01L 27/14607; H01L 27/14609; H01L 27/1461; H01L 27/14612; H01L 27/14614; H01L 27/1462; H01L 27/14623; H01L 27/14625; H01L 27/1463; H01L 27/14643; H01L 27/14665; H01L 27/14681; H01L 27/14683; H01L 27/14685; H01L 27/14636; H01L 27/14812
See application file for complete search history.

(56) References Cited

U.S. PATENT DOCUMENTS

2011/0198481 A1 8/2011 Kim et al.
2020/0029047 A1* 1/2020 Jin ...................... H04N 13/271

FOREIGN PATENT DOCUMENTS

KR 20110093212 A 8/2011
KR 20180137245 12/2018

OTHER PUBLICATIONS

Office Action for Korean Application No. 10-2019-0005854, dated Jun. 2, 2020 (w/machine translation).

* cited by examiner

*Primary Examiner* — Cheung Lee
(74) *Attorney, Agent, or Firm* — Klarquist Sparkman, LLP

(57) ABSTRACT

A pixel of an image sensor, which is capable of resolving a depth error occurring in high-speed charge transfer, includes a detector including a plurality of doped regions configured to receive light and transfer generated electrons; and a demodulator configured to receive the electrons from the detector through a plurality of transfer gates and demodulate the electrons, wherein a first doped region from among the plurality of doped regions is doped to have a first pinning voltage, and a second doped region from among the plurality of doped regions is located adjacent to the first doped region and doped to have a second pinning voltage higher than the first pinning voltage, wherein the plurality of transfer gates is located adjacent to the second doped region.

6 Claims, 14 Drawing Sheets

PIXEL OF IMAGE SENSOR USING HIGH-SPEED CHARGE TRANSFER

CROSS-REFERENCE TO RELATED APPLICATION

This application claims the benefit of Korean Patent Application No. 10-2019-0005854, filed on Jan. 16, 2019, in the Korean Intellectual Property Office, the disclosure of which is incorporated herein in its entirety by reference.

BACKGROUND

1. Field

One or more embodiments of the disclosure relate to a pixel structure for resolving a depth error occurring in high-speed charge transfer.

2. Description of the Related Art

Recently, portable apparatuses (e.g., digital cameras and mobile communication terminals) including image sensors have been developed and sold. An image sensor includes an array of small photodiodes called photosites or pixels.

In order to obtain a three-dimensional image by using an image sensor, it is necessary to obtain information about a distance between an object and the image sensor as well as information about a color. In general, an image reconstructed by using the distance between the object and the image sensor is referred to as a depth image in the relevant field. In general, the depth image may be obtained by using near-infrared light other than visible light.

Examples of methods of obtaining distance information from a sensor to an object include a time-of-flight (TOF) method involving measuring a time taken for light to travel by emitting light to the object and detecting light reflected from the object. An infrared-based depth camera emits infrared light to an object, detects light reflected from the object, and calculates a distance between the infrared-based depth camera and the object by measuring the TOF. The calculated distance is used as a depth of a depth image.

When electrons or charges generated by light emitted to and then reflected from an object are not appropriately sorted and accommodated, an error occurs in calculating distance information by using an image sensor. That is, electrons or charges generated by photodiodes need to be transferred to each gate at a high speed and thus various studies have been conducted. However, distance calculation in each study is costly and relatively inaccurate.

SUMMARY

One or more embodiments of the disclosure include an optimized pixel structure for resolving an error occurring in high-speed charge transfer.

Additional aspects will be set forth in part in the description which follows and, in part, will be apparent from the description, or may be learned by practice of the presented embodiments of the disclosure.

According to one or more embodiments of the disclosure, a pixel of an image sensor includes: a detector including a plurality of doped regions configured to receive light and transfer generated electrons; and a demodulator configured to receive the electrons from the detector through a plurality of transfer gates and demodulate the electrons, wherein a first doped region from among the plurality of doped regions is doped to have a first pinning voltage, and a second doped region from among the plurality of doped regions is located adjacent to the first doped region and doped to have a second pinning voltage higher than the first pinning voltage, wherein the plurality of transfer gates is located adjacent to the second doped region.

The second doped region may include a plurality of the second doped regions, wherein the plurality of second doped regions is located adjacent to the first doped region to be symmetric with respect to a central portion of the first doped region.

The first doped region may include a hole area that is not doped.

The plurality of transfer gates may include at least two transfer gates, wherein the at least two transfer gates are located adjacent to the second doped region and each form an angle equal to or greater than 45° and equal to or less than 90° with an imaginary line passing through a center of the first doped region and a center of the second doped region.

The demodulator may further include a drain gate, wherein the drain gate is located adjacent to the second doped region.

The drain gate may be located on the imaginary line to be adjacent to the second doped region between the plurality of transfer gates.

The pixel may include a plurality of subpixels, wherein each of the plurality of subpixels includes the detector and the demodulator.

BRIEF DESCRIPTION OF THE DRAWINGS

These and/or other aspects will become apparent and more readily appreciated from the following description of the embodiments of the disclosure, taken in conjunction with the accompanying drawings in which.

DETAILED DESCRIPTION

Figure 1A:
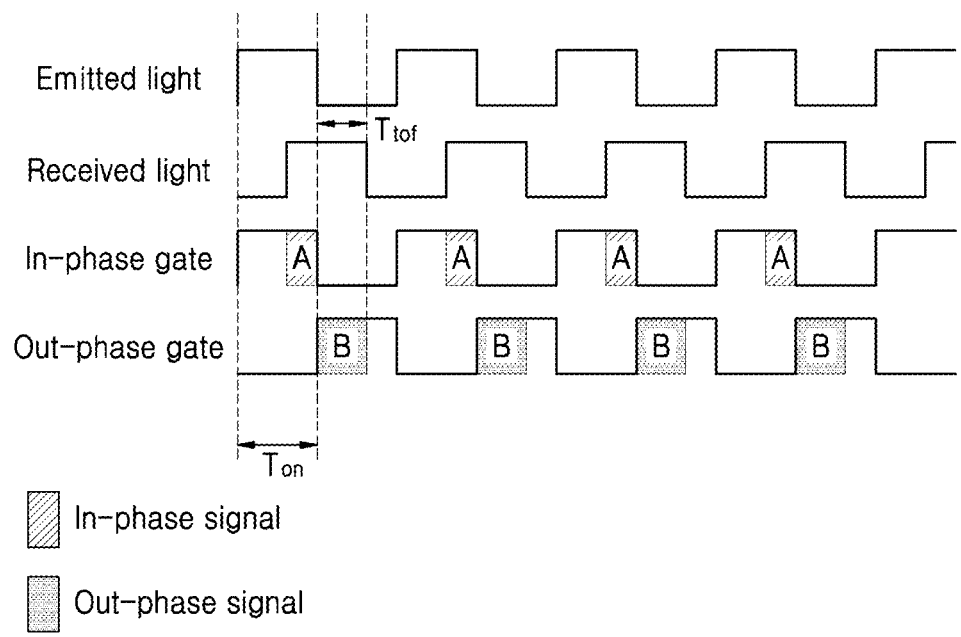
FIGS. 1A and 1B are diagrams for describing indirect time of flight (I-TOF)

Reference will now be made in detail to embodiments of the disclosure, examples of which are illustrated in the accompanying drawings. As the disclosure allows for various changes and numerous embodiments, embodiments of the disclosure will be illustrated in the drawings and described in detail in the written description. However, this is not intended to limit the disclosure to particular modes of practice, and it is to be appreciated that all changes, equivalents, and/or substitutes that do not depart from the spirit and technical scope of the disclosure are encompassed in the disclosure. Like reference numerals denote like elements in the drawings.

As used in various embodiments of the disclosure, the expressions "include", "may include" and other conjugates refer to the existence of a corresponding disclosed function, operation, or constituent element, and do not limit one or more additional functions, operations, or constituent elements. Further, as used in various embodiments of the disclosure, the terms "include", "have" and their conjugates may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Further, as used in various embodiments of the disclosure, the expression "or" includes any or all combinations of words enumerated together. For example, the expression "A or B" may include A, may include B, or may include both A and B.

While expressions including ordinal numbers, such as "first" and "second", as used in various embodiments of the disclosure may modify various constituent elements, such constituent elements are not limited by the above expressions. For example, the above expressions do not limit the sequence and/or importance of the corresponding constituent elements. The above expressions may be used merely for the purpose of distinguishing a constituent element from other constituent elements. For example, a first user device and a second user device indicate different user devices although both of them are user devices. For example, a first constituent element may be referred to as a second constituent element, and likewise a second constituent element may also be referred to as a first constituent element without departing from the scope of various embodiments of the disclosure.

When a component is referred to as being "connected" or "accessed" to or by any other component, it should be understood that the component may be directly connected or accessed by the other component, but another new component may also be interposed between them. Contrarily, when a component is referred to as being "directly connected" or "directly accessed" to or by any other component, it should be understood that there is no new component between the component and the other component.

The term such as "unit", "module", "part", or the like used in embodiments of the disclosure indicates an element, which performs at least one function or operation, and the element may be implemented by hardware or software, or by a combination of hardware and software. Also, unless a plurality of modules, units, or parts need to be implemented as individual hardware, the plurality of modules, units, or parts may be integrated into at least one module or chip and implemented as at least one processor.

The terms used in the present specification are merely used to describe embodiments of the disclosure, and are not intended to limit the disclosure. An expression used in the singular encompasses the expression of the plural, unless it has a clearly different meaning in the context.

Unless defined otherwise, all terms used herein, including technical terms and scientific terms, have the same meaning as commonly understood by one of ordinary skill in the art to which various embodiments of the disclosure pertain.

Such terms as those defined in a generally used dictionary are to be interpreted to have the meanings equal to the contextual meanings in the relevant field of art, and are not to be interpreted to have ideal or excessively formal meanings unless clearly defined in various embodiments of the disclosure.

Expressions such as "at least one of," when preceding a list of elements, modify the entire list of elements and do not modify the individual elements of the list.

The disclosure will now be described more fully with reference to the accompanying drawings, in which various embodiments of the disclosure are shown.

Figure 1B:
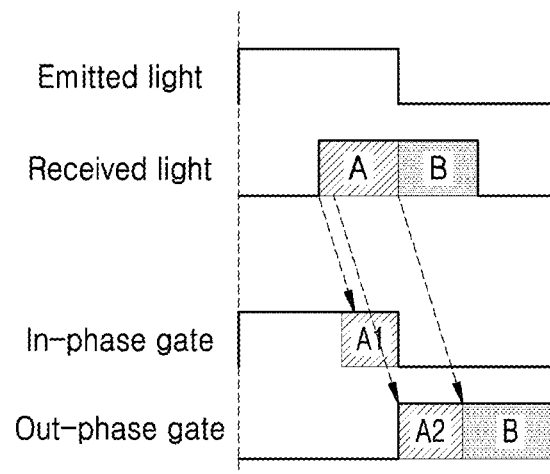

FIGS. 1A and 1B are diagrams for describing indirect time of flight (I-TOF).

Referring to FIG. 1A, a conventional image sensor may detect light (referred to as received light) emitted to an object and then reflected from the object. In this case, the received light may be, but is not limited to, an electromagnetic wave in a near-infrared range.

The conventional image sensor may find out a distance to the object based on I-TOF. In detail, a pixel of the conventional image sensor may compare a phase difference of the received light. The pixel may accept electrons generated by in-phase light through an in-phase gate, and may accept electrons generated by out-of-phase light through an out-of-phase gate. In this case, A may correspond to a portion of the received light that is in phase with light for modulation, and B may correspond to a portion that is out of phase. The pixel may calculate a distance $$D \text{ (distance)} = \frac{C}{2} T_{tof} = \frac{C}{2} \frac{A}{A+B}$$

to the object based on a ratio of electrons accepted through gates, that is, a ratio of electrons generated by the portions A and B.

Electrons generated by the received light may be accepted through gates after the in-phase gate and the out-of-phase gate in the pixel are turned on or off. Referring to FIG. 1B, when electrons generated by the received light do not rapidly move due to the in-phase gate and the out-of-phase gate, electrons generated by the portions A and B may not be accepted as intended.

In this case, the pixel may determine that a ratio of light having a phase difference is different from the actual received light, and an error may occur in measuring the distance to the object. For example, a ratio of electrons generated by the received light reaching the pixel is $$\frac{B}{A+B}$$

but, in the case of FIG. 1B, a phase difference ratio becomes $$\frac{A2+B}{A+B},$$

and thus an error occurs in calculating the distance to the object.

That is, in order to prevent such an error, it is necessary to transfer electrons generated by received light to each gate at a high speed.

Figure 2A:
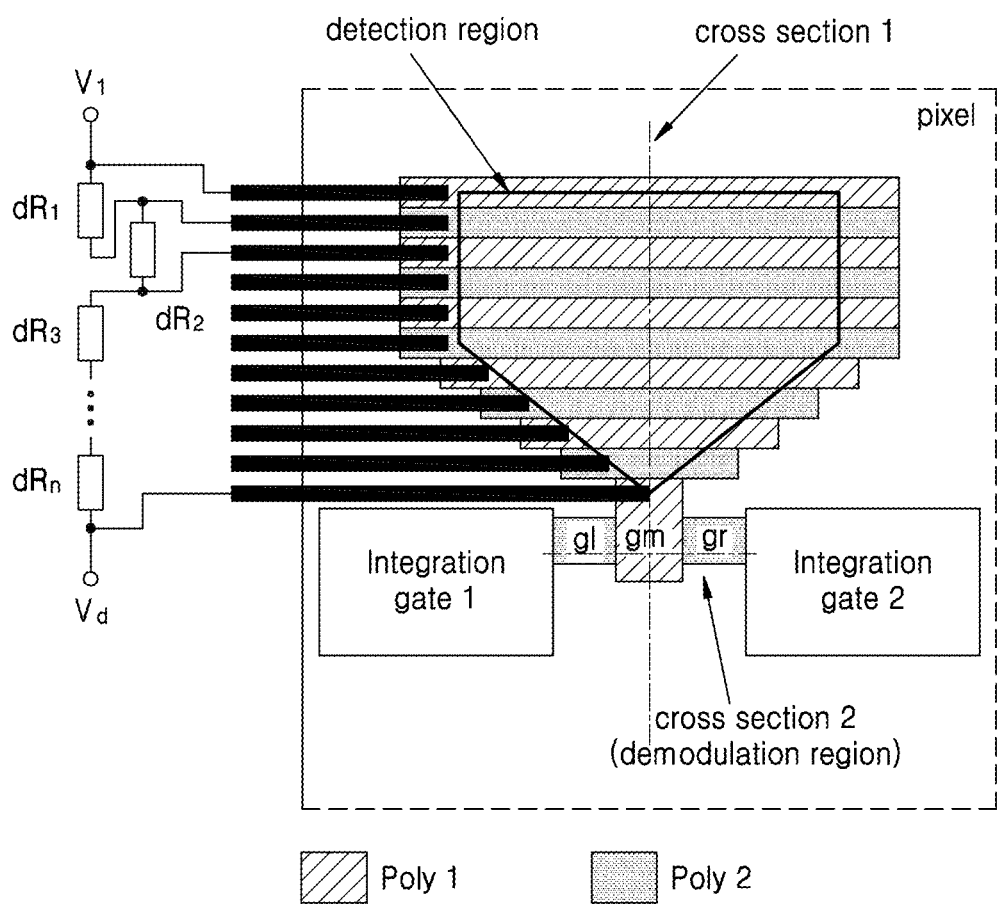
FIGS. 2A and 2B are diagrams for describing a pixel structure of a conventional image sensor.
Figure 2B:
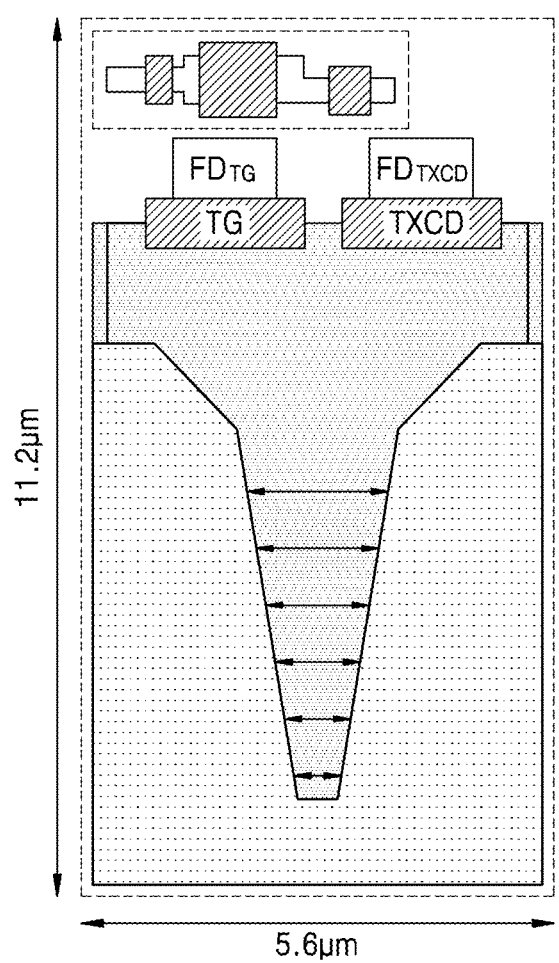

FIGS. 2A and 2B are diagrams for describing a pixel structure of a conventional image sensor.

A pixel of FIG. 2A forms a potential gradient by applying a voltage to a photodiode region by using two or more polysilicons. In detail, because the two or more polysilicons are blocked by an insulator so that current does not flow, a voltage may be applied to a photodiode portion in the pixel. A potential difference may occur according to a voltage applied from $dR_1$ to $dR_n$, and electrons may be transferred to a demodulation region due to a drift force caused by the potential difference. Accordingly, the pixel of FIG. 2A may transfer electrons generated by reflected light to each gate at a high speed.

However, a complementary metal-oxide semiconductor (CMOS) method is performed only by using one polysilicon. When one polysilicon is used, a bias may not be applied and electrons have to move through diffusion, and thus the pixel has to be implemented by using a charge-coupled device (CCD) method. However, the CCD method requires high costs.

A pixel of FIG. 2B uses a difference of a pinning voltage according to the width of an n-doped region, without separately applying a voltage. In detail, a low pinning voltage is applied to a narrow n-doped region, and a high pinning voltage is applied to a wide n-doped region. Accordingly, electrons may be transferred to each gate at a high speed due to a drift force through a potential difference.

However, in order to generate a sufficient potential gradient, the pixel of FIG. 2B has a long length and an electron movement time is long. As an electron movement time increases, the risk of an error of FIG. 1 increases.

A pixel according to various embodiments of the disclosure for solving the above problems is suggested.

Figure 3:
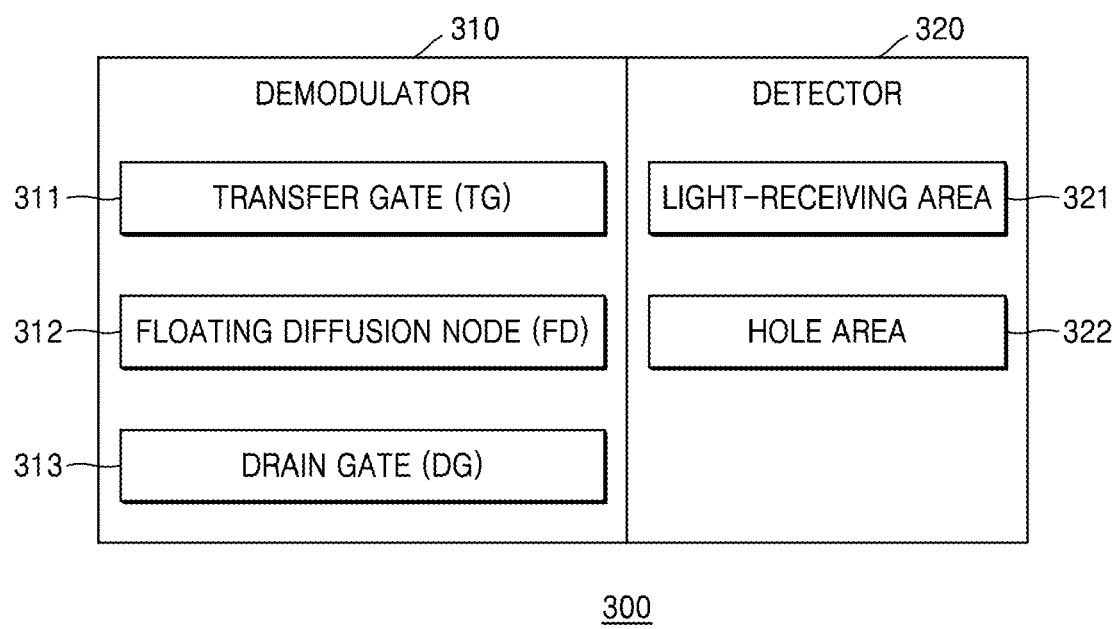
FIG. 3 is a block diagram for describing elements of a pixel according to an embodiment of the disclosure.

FIG. 3 is a block diagram for describing elements of a pixel 300 according to an embodiment of the disclosure.

Referring to FIG. 3, the pixel 300 may include a demodulator 310 and a detector 320. The demodulator 310 may include a transfer gate (TG) 311, a floating diffusion node (FD) 312, and a drain gate (DG) 313. The detector 320 may include a light-receiving area 321 and a hole area 322.

The pixel 300 of an image sensor may have any of various structures such as a 1-transistor structure, a 3-transistor structure, a 4-transistor structure, or a 5-transistor structure, and may have a structure of sharing some transistors with a pixel adjacent to the pixel 300. For example, the pixel 300 of the image sensor may further include a reset transistor (RX) for resetting the FD 312 in response to a reset signal (RS), a drive transistor (DX) for generating an output signal corresponding to charges stored in the FD 312, and a select transistor (SX) for outputting an output signal in response to a select signal (SEL). Also, the RX, the DX, and the SX may be shared between adjacent pixels.

The TG 311 may be a gate operating at a predetermined duty ratio to transfer electrons from the detector 320 to the demodulator 310. For example, the TG 311 may include an out-of phase gate and an in-phase gate operating in phase with an electromagnetic wave for modulation.

The FD 312 is spaced apart from the detector 320. Electrons generated by the detector 320 and transferred through the TG 311 may be stored in the FD 312. The electrons transferred through the TG 311 to the demodulator 310 may be accumulated in the FD 312, and light modulated with the accumulated electrons may be demodulated. In an embodiment of the disclosure, the FD 312 may be formed by being doped with second conductivity-type (e.g., n-type) impurities.

The DG 313 may be provided to emit electrons or photo-charges generated during an undesired period of time.

The detector 320 may include the light-receiving area 321, for example, a photodiode, for receiving reflected light.

The light-receiving area 321 may generate charges (e.g., photo-charges) based on incident reflected light. For example, electron-hole pairs may be generated in response to incident light, and the pixel 300 may collect such electrons or holes.

The light-receiving area 321 may include a photodiode, a pinned photodiode (PPD), a phototransistor, a transfer gate, or a combination thereof.

The light-receiving area 321 may include the same p-type semiconductor substrate, e.g., silicon substrate, as a p-type substrate P-SUB. Also, the light-receiving area 321 may include an n-type impurity region, or an n-type impurity region and a p-type impurity region alternately stacked in a vertical direction. The TG 311 may be located at an end portion of the light-receiving area 321.

The light-receiving area 321 according to an embodiment of the disclosure may include one or more doped regions doped with n-type impurities of different concentrations. The doped regions doped with the j-type impurities of different concentrations may have different pinning voltages.

The light-receiving area 321 may include the hole area 322 that is not doped with n-type impurities. The hole area 322 may have a pinning voltage lower than those of other doped regions.

Figure 4:
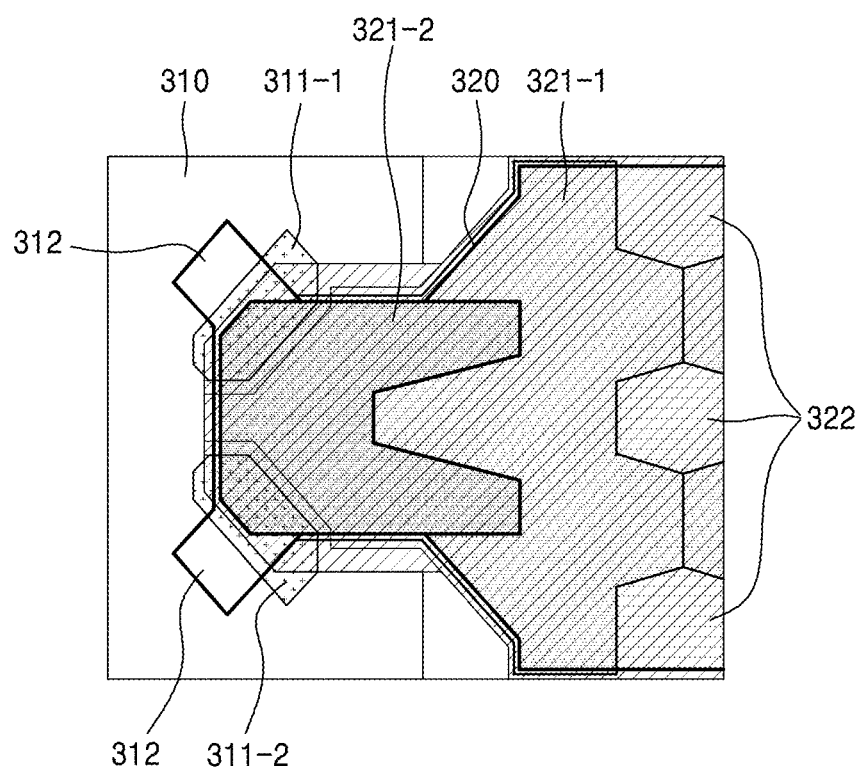
FIG. 4 is a plan view of the pixel having a 2-wing unit structure according to an embodiment of the disclosure.

FIG. 4 is a plan view of the pixel 300 having a 2-wing unit structure according to an embodiment of the disclosure.

Referring to FIG. 4, the light-receiving area 321 of the detector 320 of the disclosure may include a first doped region 321-1 and a second doped region 321-2 doped with n-type impurities of different concentrations. In this case, the second doped region 321-2 may have an n-type doping concentration higher than that of the first doped region 321-1, and thus a pinning voltage of the second doped region 321-2 may be higher than that of the first doped region 321-1.

The second doped region 321-2 may be narrower than the first doped region 321-1, and the first doped region 321-1 may taper and may be connected in a funnel shape to the second doped region 321-2. Accordingly, electrons gathered in the second doped region 321-2 may easily move through the TG 311 to the FD 312.

Furthermore, the detector 320 of the disclosure may include the hole area 322, and a potential voltage of the hole area 322 may be lower than that of the first doped region 321-1 and the second doped region 321-2. In this case, the hole area 322 may be located in the first doped region 321-1, and may be located at a position corresponding to a radial line of the funnel shape from the second doped region 321-2 to the first doped region 321-1.

In this case, a potential gradient may be formed in an order of the hole area 322, the first doped region 321-1, and the second doped region 321-2 in the detector 320 of the pixel 300. That is, electrons generated in the light-receiving area 321 by reflected light may move to the TG 311 due to the potential gradient formed in the order of the hole area 322, the first doped region 321-1, and the second doped region 321-2.

According to the above embodiment of the disclosure, because a potential gradient may be formed in the light-receiving area 321 without using a plurality of polysilicons, the potential gradient may be formed by using a CMOS method at low costs. The above embodiment is merely an example, and a potential gradient may be formed through doping in various ways.

A first TG 311-1 and a second TG 311-2 may be turned on/off in different operation cycles. In detail, the first TG 311-1 may be implemented to have the same frequency as that of light for modulation in a pixel. In this case, the first TG 311-1 may accept electrons generated by in-phase light. In contrast, the second TG 311-2 may be implemented to have a cycle complementary to that of the first TG 311-1, and may accept electrons generated by out-of-phase light. Such a structure having two transfer gates may be referred to as a 2-wing structure.

A potential gradient may be formed when the first TG 311-1 and the second TG 311-2 are turned on. In this case, electrons existing in the second doped region 321-2 may move more efficiently to each transfer gate due to a drift force according to the potential gradient. Light modulated with electrons accumulated in the FD 312 through the first TG 311-1 and the second TG 311-2 may be demodulated by the demodulator 310.

In this case, the first TG 311-1 and the second TG 311-2 may be located at specific positions and at specific angles in the second doped region 321-2. In this case, the specific angles may be angles formed with an imaginary line that connects the centers of the first doped region 321-1 and the second doped region 321-2, which will be described in detail with reference to FIG. 6.

Figure 5A:
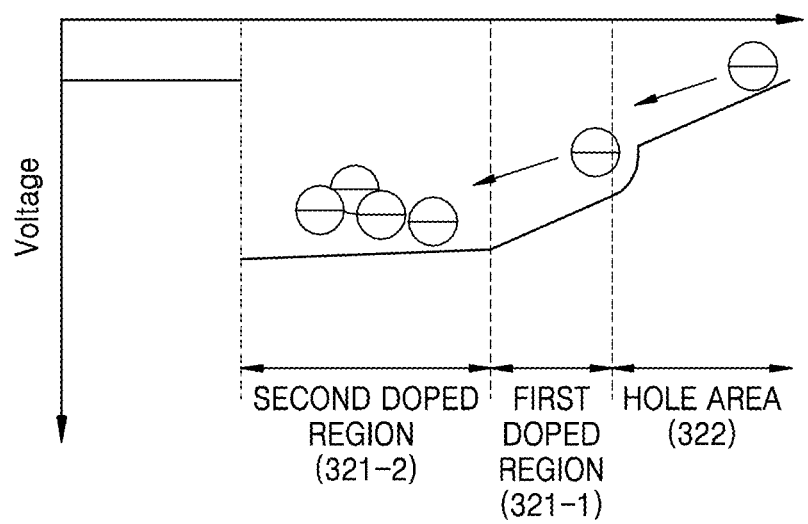
FIGS. 5A and 5B are diagrams for describing a movement of electrons due to a drift force according to a potential difference in the pixel according to an embodiment of the disclosure.
Figure 5B:
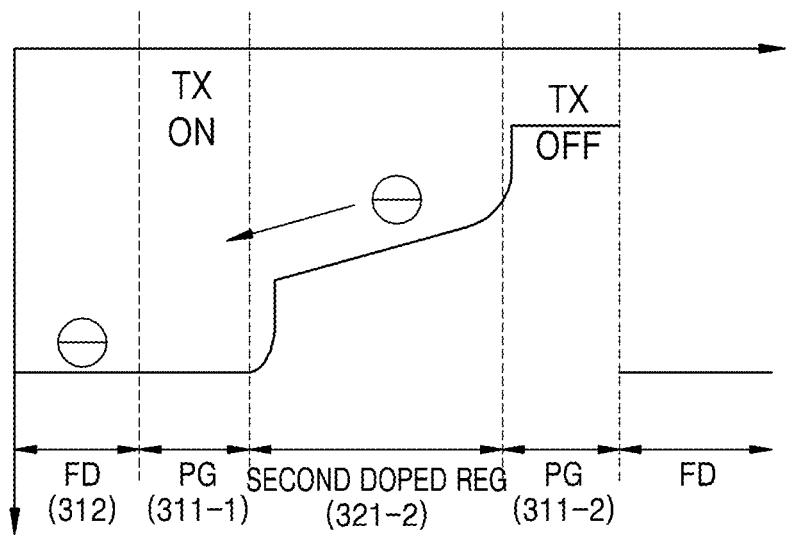

FIGS. 5A and 5B are diagrams for describing a movement of electrons due to a drift force according to a potential difference in the pixel 300 according to an embodiment of the disclosure.

Referring to FIG. 5A, electrons generated in the light-receiving area 321 may be transferred due to a drift force according to a potential gradient.

A voltage of the hole area 322 may be the lowest. Accordingly, electrons generated in the hole area 322 may move to the first doped region 321-1. Likewise, a voltage of the first doped region 321-1 may be lower than that of the second doped region 321-2. Accordingly, the electrons transferred from the hole area 322 and electrons generated in the first doped region 321-1 may move to the second doped region 321-2.

Although the voltages of the hole area 322, the first doped region 321-1, and the second doped region 321-2 may gradually increase as shown in FIG. 5A, this is merely an example and the voltages may increase stepwise according to a doping state.

Referring to FIG. 5B, when the first TG 311-1 is turned on, a voltage of the first TG 311-1 increases. Accordingly, electrons generated in the second doped region 321-2 or transferred from the first doped region 321-1 may move to the FD 312 due to a drift force according to a potential gradient with the first TG 311-1.

In this case, the second TG 311-2 is turned off, and a voltage of the second TG 311-2 in the off state is maintained at a low level. Accordingly, electrons move only to the first TG 311-1 as described above.

When the second TG 311-2 that has a cycle complementary to that of the first TG 311-1 is turned on, the first TG 311-1 is turned off. In this case, a voltage of the second TG 311-2 may increase, and electrons may move to the FD 312 due to a drift force according to a potential gradient with the second TG 311-2.

Figure 6:
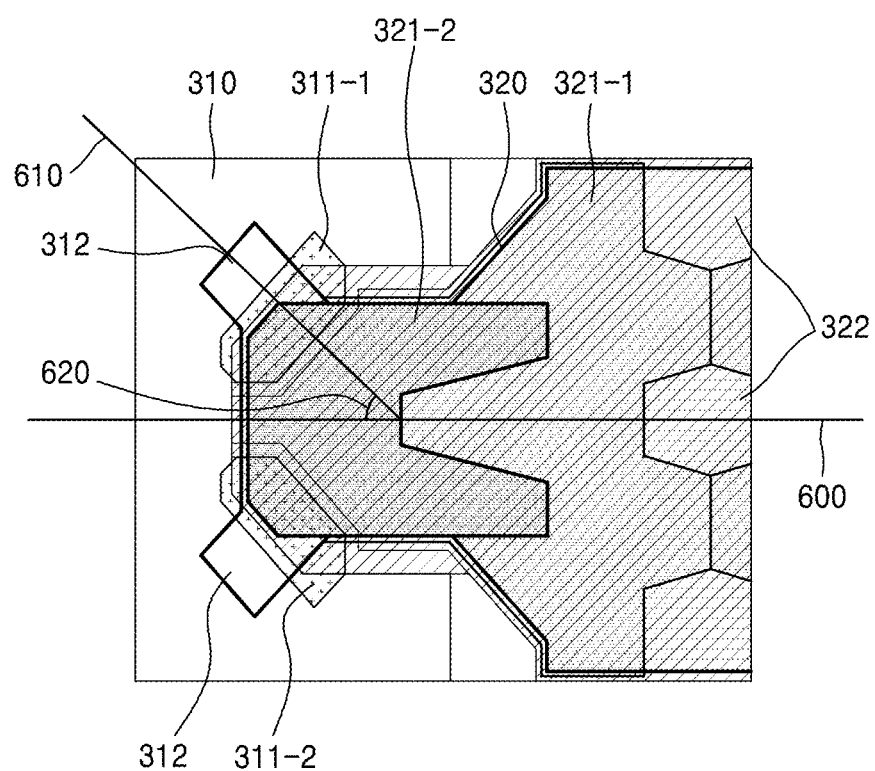
FIG. 6 is a diagram for describing a position of a transfer gate according to an embodiment of the disclosure.

FIG. 6 is a diagram for describing a position of a transfer gate according to an embodiment of the disclosure.

Referring to FIG. 6, the first TG 311-1 may be located to form a predetermined angle or more with an imaginary line 600 passing through the center of the first doped region 321-1 and the center of the second doped region 321-2. In this case, each of the center of the first doped region 321-1 and the center of the second doped region 321-2 may be, but is not limited to, the center of mass.

In this case, an angle 620 formed between the first TG 311-1 and the imaginary line 600 may be an angle formed between the imaginary line 600 and a line 610 perpendicular to a path through which electrons are introduced into the first TG 311-1.

According to an embodiment of the disclosure, the angle 620 may be equal to or greater than 45° and equal to or less than 90°. When the angle 620 at which a transfer gate is located is 90°, electrons may laterally move past the transfer gate, and the transfer gate may accept electrons due to a drift force according to a potential gradient formed when the transfer gate is turned on/off. In this case, since there is no transfer gate in a lateral movement path of the electrons, noise due to the transfer gate may be reduced.

According to an embodiment of the disclosure, the first TG 311-1 and the second TG 311-2 may be located adjacent to the second doped region 321-2 to have the same angle with the imaginary line 600.

However, the above angle is merely an example, and a transfer gate may be located at any of various angles according to various embodiments.

Figure 7A:
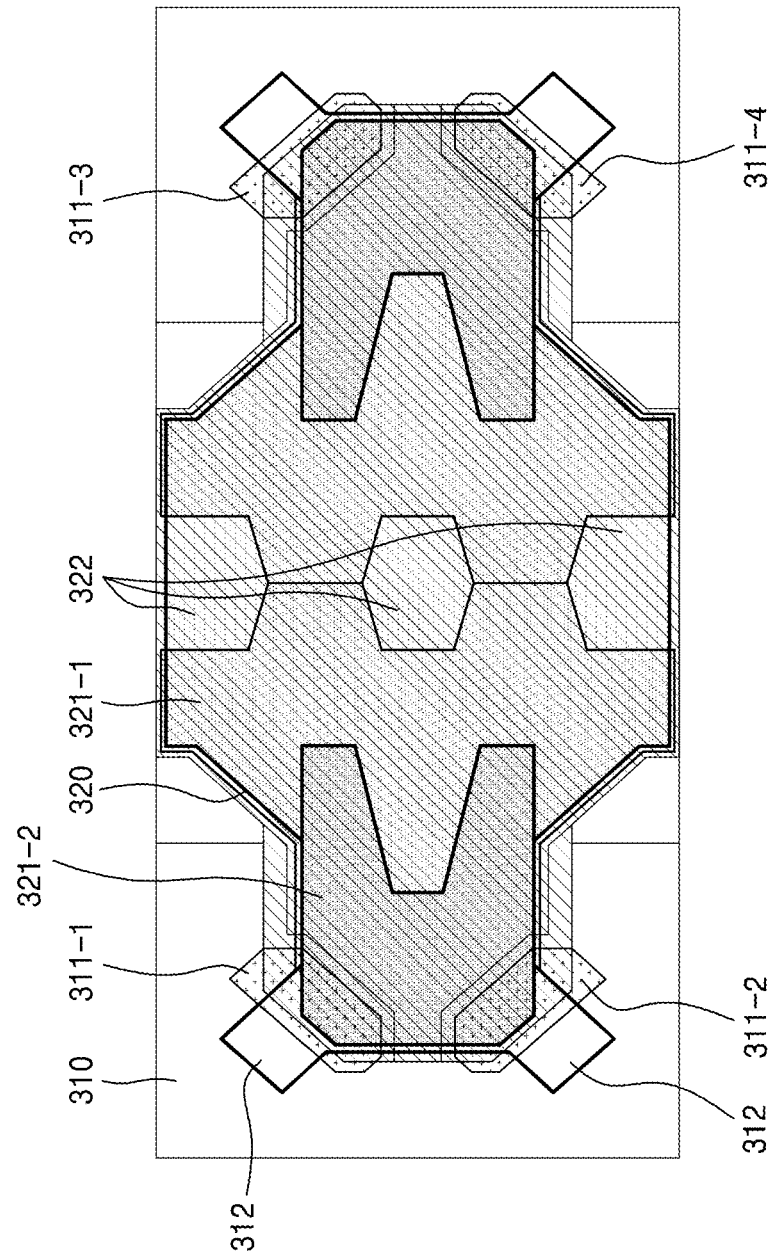
FIGS. 7A and 7B are diagrams for describing a pixel structure according to various embodiments of the disclosure.
Figure 7B:
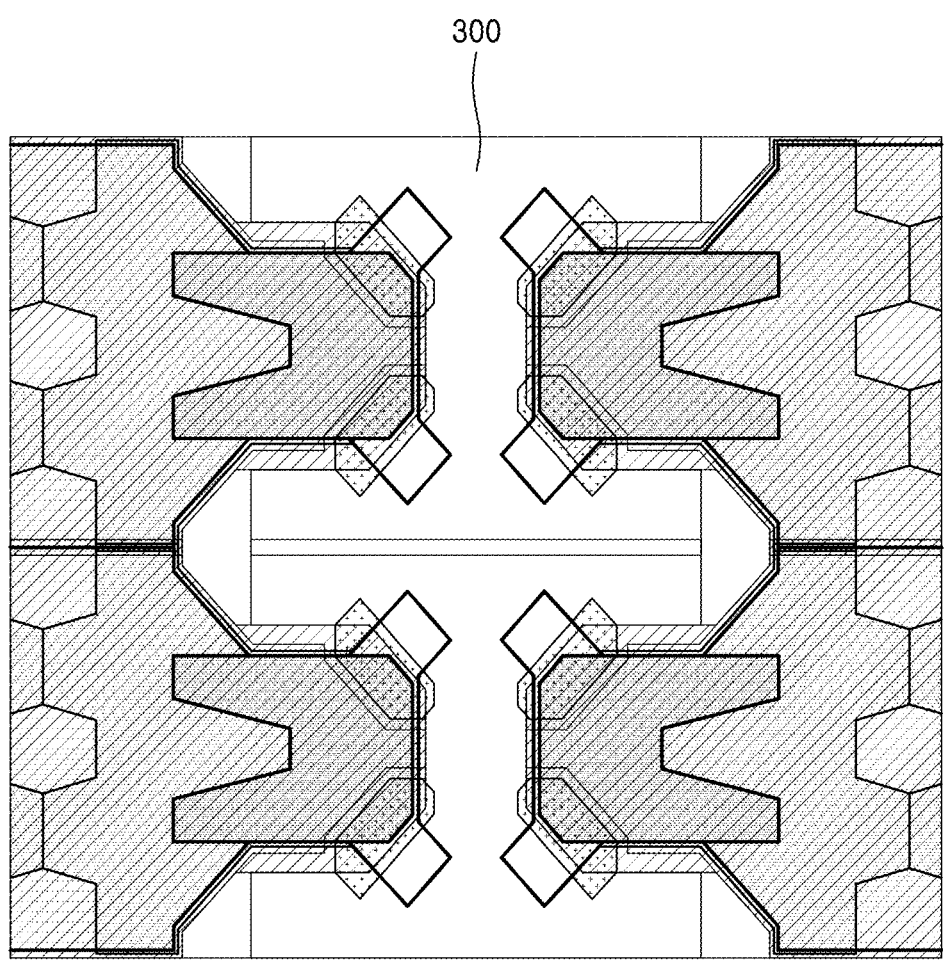

FIGS. 7A and 7B are diagrams for describing a pixel structure according to various embodiments of the disclosure.

Referring to FIG. 7A, the pixel 300 may include two unit structures of FIG. 4 that are symmetric with respect to the hole area 322. According to an embodiment of the disclosure, the pixel 300 may include two or more second doped regions 321-2, which are located adjacent to the first doped region 321-1 to be symmetric with respect to the hole area 322 or a central portion of the first doped region 321-1.

Although the hole area 322 is located at the central portion of the first doped region 321-1 in FIG. 7A, the disclosure is not limited thereto, and according to an embodiment of the disclosure, a plurality of the hole areas 322 may be uniformly arranged along the central portion of the first doped region 321-1 in a direction corresponding to a direction in which the second doped regions 321-2 are located. In this case, when the plurality of hole areas 322 are uniformly arranged, it may mean that the hole areas 322 are arranged at a predetermined angle and distance with respect to the central portion of the first doped region 321-1.

That is, a direction in which the hole area 322 and the first doped region 321-1 are formed and a direction in which the first doped region 321-1 and the second doped region 321-2 are formed may be the same. Accordingly, electrons or charges generated in the hole area 322 and the first doped region 321-1 may rapidly move to the second doped region 322-2 due to a drift force continuously applied in the same direction.

The first TG 311-1 and a third TG 311-3 may be implemented to accept electrons generated by in-phase light, and the second TG 311-2 and a fourth TG 311-4 may be implemented to accept electrons generated by out-of-phase light. However, this is an example, and the first TG 311-1 and the fourth TG 311-4 may be implemented to accept electrons generated by in-phase light, and the second TG 311-2 and the third TG 311-3 may be implemented to accept electrons generated by out-of-phase light.

Referring to FIG. 7B, the pixel 300 may include a plurality of unit structures of FIG. 4 that are symmetric with respect to the demodulator 310. That is, the pixel 300 may include a plurality of subpixels, and each subpixel may include the unit structure of FIG. 4.

The pixel 300 of each of FIGS. 7A and 7B may maximize a light-receiving area for receiving light and may reduce a distance by which electrons move to the demodulator 310.

Figure 8:
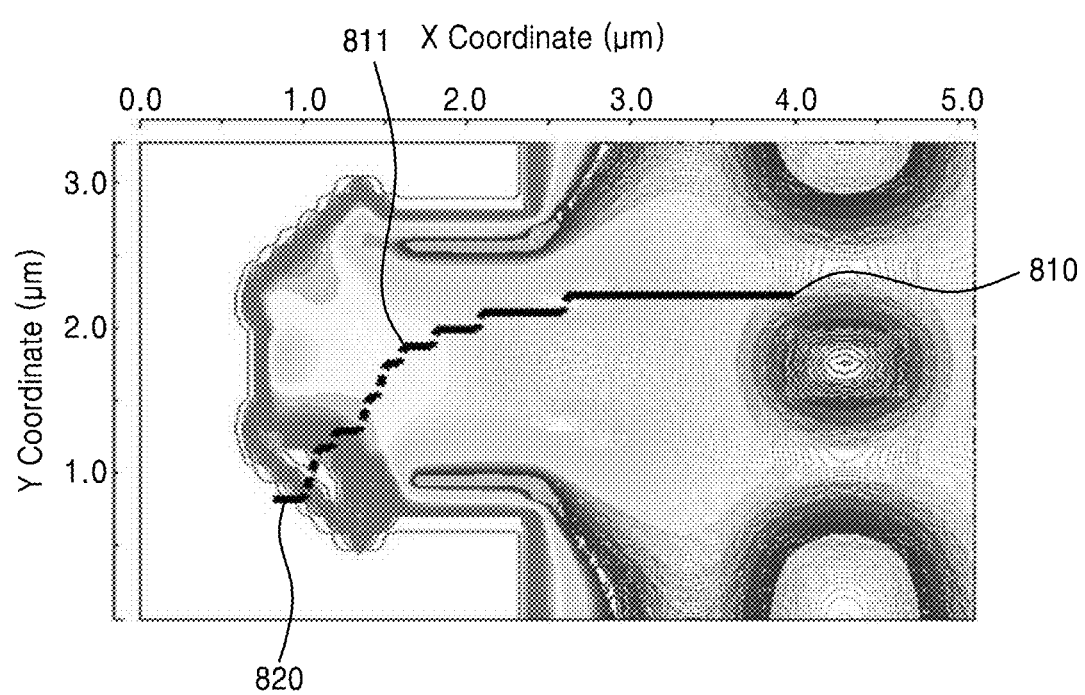
FIG. 8 is a diagram for describing a flow of electrons in the pixel according to an embodiment of the disclosure.

FIG. 8 is a diagram for describing a flow of electrons in the pixel according to an embodiment of the disclosure.

FIG. 8 illustrates a flow of electrons in the pixel 300 having a 2-wing unit structure. Referring to FIG. 8, an area closer to blue has a lower voltage, and an area closer to red has a higher voltage. Electrons may move due to a drift force from a hole area point 810 having a low voltage to a transfer gate point 820 having a high voltage.

In detail, electrons may move due to a drift force in two steps. That is, electrons may move due to a drift force caused by a potential gradient according to a doping concentration from the hole area point 810 to a doped region point 811. Next, the electrons may move due to a drift force caused by a potential difference due to a voltage difference according to on/off of a transfer gate from the doped region point 811 to the transfer gate point 820.

Figure 9:
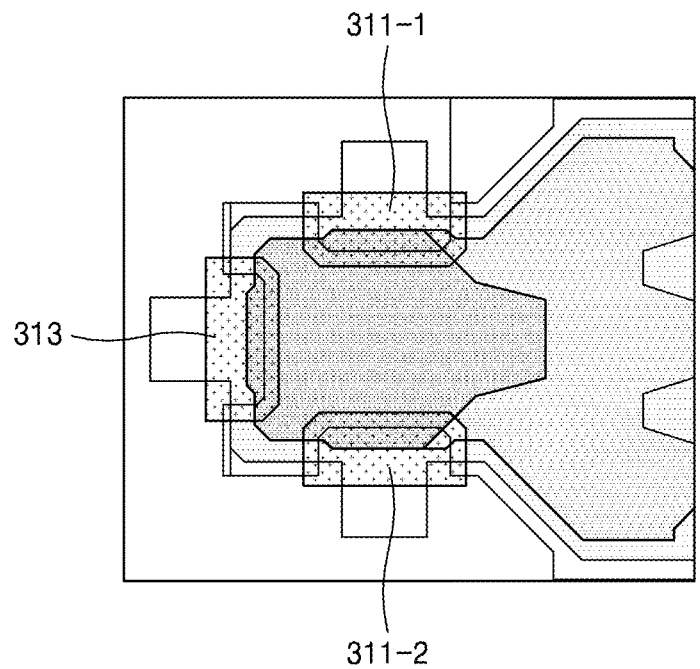
FIG. 9 is a diagram for describing the pixel including a drain gate unit structure according to an embodiment of the disclosure.

FIG. 9 is a diagram for describing the pixel 300 including a drain gate unit structure according to an embodiment of the disclosure.

Referring to FIG. 9, the pixel 300 may include the DG 313 in addition to the first TG 311-1 and the second TG 311-2. The DG 313 may be located between the first TG 311-1 and the second TG 311-2. In detail, the DG 313 may be located on the imaginary line 600 between the first TG 311-1 and the second TG 311-2. Although the angle 620 between the imaginary line 600 and the first TG 311-1 and the second TG 311-2 is 90° in FIG. 9, the disclosure is not limited thereto.

When the first TG 311-1 and the second TG 311-2 are turned off, the DG 313 is used to eliminate background light, which will be described in detail with reference to FIG. 10.

Figure 10:
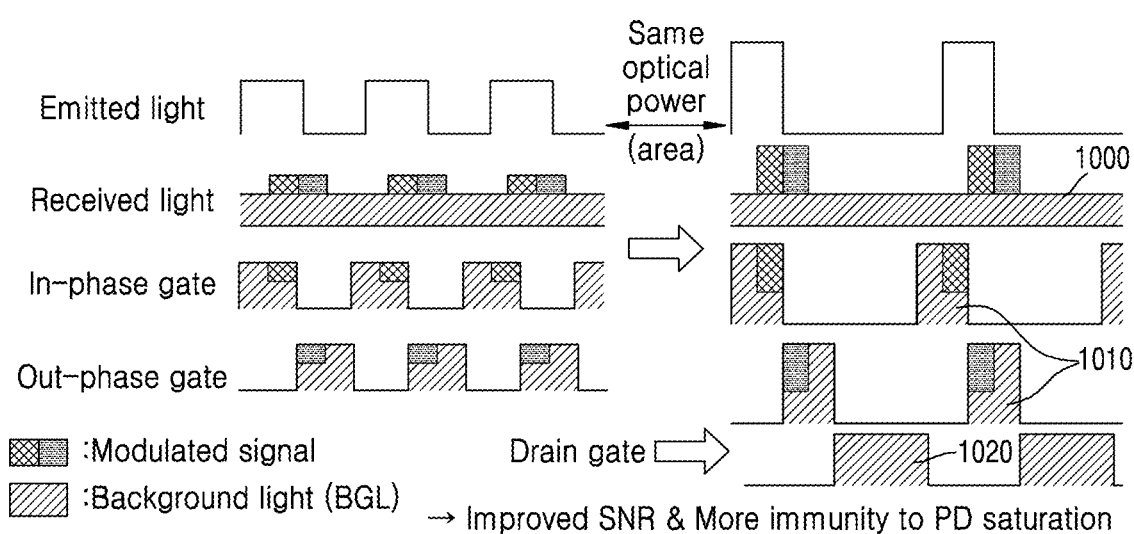
FIG. 10 is a diagram for describing an operation of a drain gate (DG) of the disclosure.

FIG. 10 is a diagram for describing an operation of a DG of the disclosure.

An image sensor including the pixel 300 of the disclosure may more intermittently emit light with the same optical power to obtain a high signal-to-noise ratio (SNR).

In this case, background light 1000 may be included in light (referred to as received light) emitted to an object and then reflected from the object. The background light 1000 may cause an error when the image sensor calculates a distance to the object.

The pixel 300 may separately accept the received light through an in-phase gate and an out-of-phase gate. In this case, background light 1010 may be included in signals accepted in the in-phase gate and the out-of-phase gate.

The DG 313 of the disclosure may determine any signal entering while the in-phase gate and the out-of-phase gate do not operate as background light 1020.

That is, the DG 313 may be turned on while the in-phase gate and the out-of-phase gate do not operate and may prevent saturation of a photodiode (PD) by eliminating electrons accumulated in the PD of a light-receiving area.

Figure 11A:
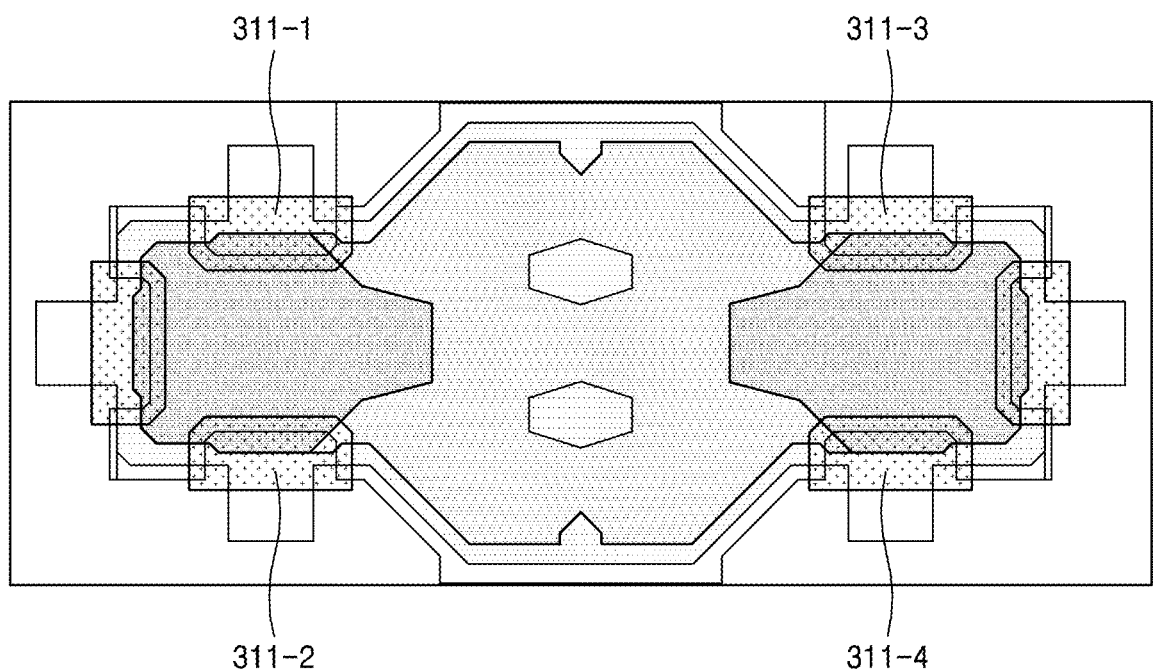
FIGS. 11A and 11B are diagrams for describing various embodiments of a unit structure including a DG of the disclosure.
Figure 11B:
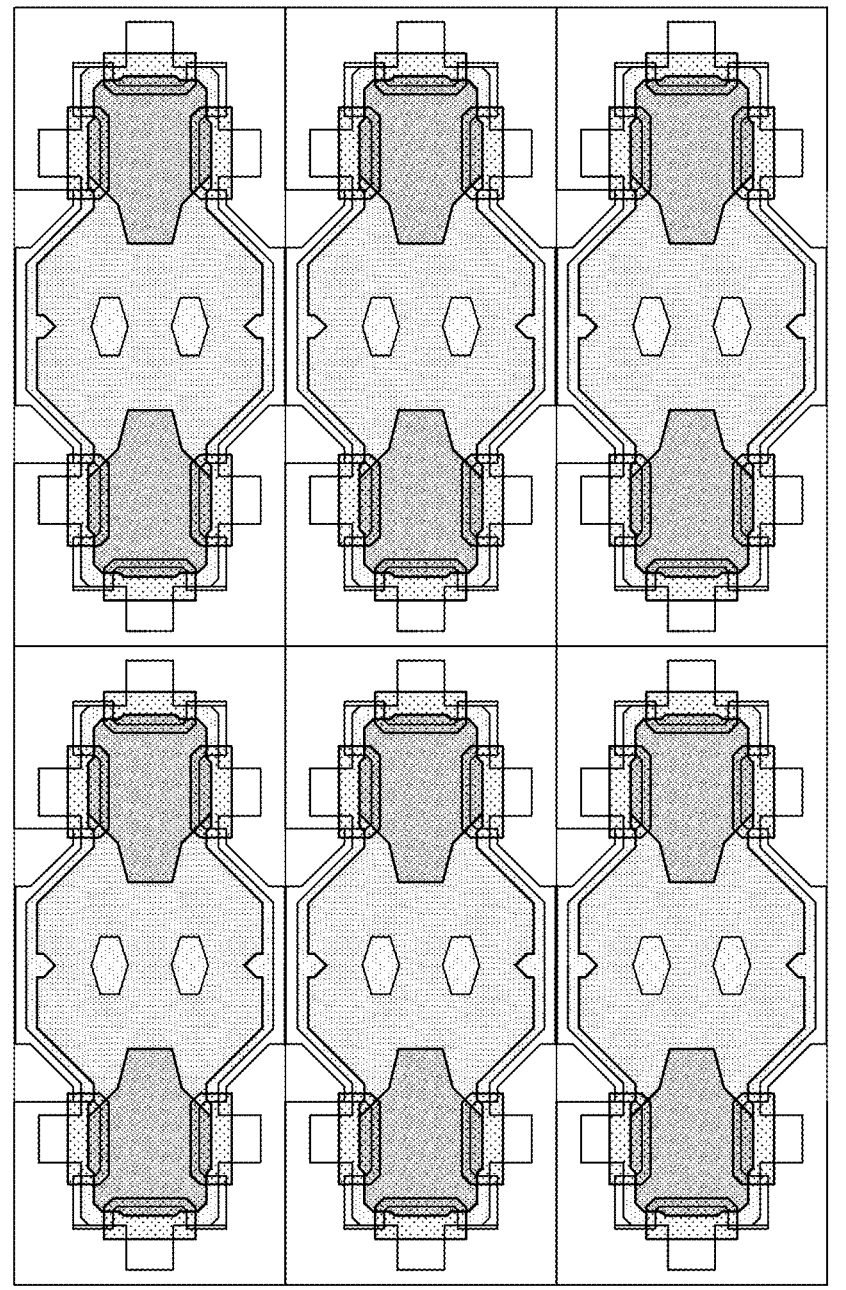

FIGS. 11A and 11B are diagrams for describing various embodiments of a unit structure including a DG of the disclosure.

Referring to FIG. 11A, the pixel 300 may include two unit structures of FIG. 9 that are symmetric with respect to the hole area 322.

In this case, the first TG 311-1 and the third TG 311-3 may be implemented to accept electrons generated by in-phase light, and the second TG 311-2 and the fourth TG 311-4 may be implemented to accept electrons generated by out-of-phase light. However, this is an example, and the first TG 311-1 and the fourth TG 311-4 may be implemented to accept electrons generated by in-phase light, and the second TG 311-2 and the third TG 311-3 may be implemented to accept electrons generated by out-of-phase light.

Referring to FIG. 11B, the pixel 300 may include a plurality of unit structures of FIG. 11A in a binning arrangement.

In the case of a plurality of unit structures in a binning arrangement as shown in FIG. 11B, a movement distance of electrons generated in a PD may be kept short. In this case, the pixel 300 may not apply a separate potential gradient. However, the disclosure is not limited thereto, and a potential difference may be added through doping.

Because a movement distance of electrons generated in a light-receiving area is short, even when a modulation frequency increases, the pixel 300 may effectively improve accuracy in calculating a distance to an object.

Figure 12:
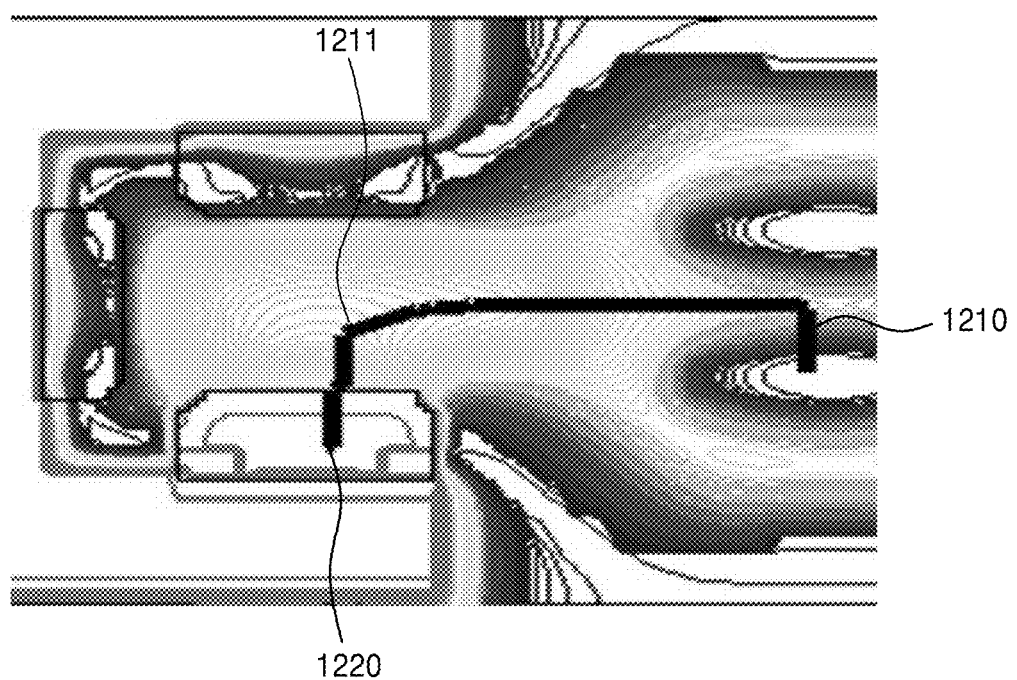
FIG. 12 is a diagram for describing a flow of electrons in the pixel including a DG according to an embodiment of the disclosure.

FIG. 12 is a diagram for describing a flow of electrons in the pixel 300 including a DG according to an embodiment of the disclosure.

FIG. 12 illustrates a flow of electrons in the pixel 300 including a unit structure including a DG. Referring to FIG. 12, an area closer to blue has a lower voltage, and an area closer to red has a higher voltage. Electrons may move due to a drift force from a hole area point 1210 having a low voltage to a transfer gate point 1220 having a high voltage.

In detail, electrons may move due to a drift force in two steps. That is, electrons may move due to a drift force caused by a potential gradient according to a doping concentration from the hole area point 1210 to a doped region point 1211. Next, the electrons may move due to a drift force caused by a potential difference due to a voltage difference according to on/off of a transfer gate from the doped region point 1211 to the transfer gate point 1220.

According to the one or more embodiments of the disclosure, there may be provided a pixel structure capable of forming a drift force according to a potential gradient in a pixel and obtaining a depth image with improved precision at low costs by allowing for a lateral movement of electrons due to the drift force.

The scope of the disclosure is not limited by such effects.

While one or more embodiments of the disclosure have been described with reference to the figures, it will be understood by one of ordinary skill in the art that various changes in form and details may be made therein without departing from the spirit and scope of the disclosure as defined by the following claims.

What is claimed is:

1. A pixel of an image sensor, the pixel comprising:
a detector comprising a plurality of doped regions configured to receive light and transfer generated electrons; and
a demodulator configured to receive the electrons from the detector through a plurality of transfer gates and demodulate the electrons,
wherein a first doped region from among the plurality of doped regions is doped to have a first pinning voltage, and a second doped region from among the plurality of doped regions is located adjacent to the first doped region and doped to have a second pinning voltage higher than the first pinning voltage, wherein the plurality of transfer gates is located adjacent to the second doped region, wherein the first doped region is coupled to and tapers toward the second doped region, and the second doped region is narrower than the first doped region such that the first doped region and the second doped region are configured in a funnel shape, and wherein a non-doped region of the first doped region comprises a hole area located at a position corresponding to a radial line of the funnel shape of the first doped region and the second doped region.

2. The pixel of claim 1, wherein the second doped region comprises a plurality of the second doped regions, wherein the plurality of second doped regions is located adjacent to the first doped region to be symmetric with respect to a central portion of the first doped region.

3. The pixel of claim 1, wherein the plurality of transfer gates comprises at least two transfer gates, wherein the at least two transfer gates are located adjacent to the second doped region and each form an angle equal to or greater than 45° and equal to or less than 90° with an imaginary line passing through a center of the first doped region and a center of the second doped region.

4. The pixel of claim 3, wherein the demodulator further comprises a drain gate, wherein the drain gate is located adjacent to the second doped region.

5. The pixel of claim 4, wherein the drain gate is located on the imaginary line to be adjacent to the second doped region between the plurality of transfer gates.

6. The pixel of claim 1, wherein the pixel comprises a plurality of subpixels, wherein each of the plurality of subpixels comprises the detector and the demodulator.

* * * * *